(12) United States Patent
Watanabe

(10) Patent No.: US 6,680,244 B2
(45) Date of Patent: Jan. 20, 2004

(54) METHOD FOR MANUFACTURING SEMICONDUCTOR DEVICE

(75) Inventor: Hitomi Watanabe, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 09/808,071

(22) Filed: Mar. 14, 2001

(65) Prior Publication Data

US 2001/0034098 A1 Oct. 25, 2001

(30) Foreign Application Priority Data

Apr. 19, 2000 (JP) .......................... 2000-117965
Apr. 19, 2000 (JP) .......................... 2000-117969
Jan. 11, 2001 (JP) .......................... 2001-004060

(51) Int. Cl.[7] ............................................. H01L 21/00
(52) U.S. Cl. ...................... 438/585; 438/593; 438/258; 438/266
(58) Field of Search ..................... 438/264, 257–263, 438/265.7, 585, 593, 594

(56) References Cited

U.S. PATENT DOCUMENTS

| 4,140,548 | A | * | 2/1979 | Zimmer | 438/301 |
| 5,296,411 | A | * | 3/1994 | Gardner et al. | |
| 5,362,685 | A | * | 11/1994 | Gardner et al. | 438/264 |
| 5,521,127 | A | * | 5/1996 | Hori | 438/264 |
| 5,538,923 | A | * | 7/1996 | Gardner et al. | 438/264 |
| 5,591,681 | A | * | 1/1997 | Wristers et al. | 438/264 |
| 6,190,973 | B1 | * | 2/2001 | Berg et al. | 438/275 |
| 6,207,506 | B1 | * | 3/2001 | Yi et al. | 438/264 |

* cited by examiner

Primary Examiner—Richard Booth
(74) Attorney, Agent, or Firm—Adams & Wilks

(57) ABSTRACT

A method for manufacturing a semiconductor device comprises the steps of forming a gate oxide film on a surface of a semiconductor substrate, subjecting the gate oxide film to a nitriding treatment, forming a gate electrode film over the surface of the semiconductor substrate, annealing the gate oxide film in an inert gas atmosphere after the nitriding treatment and after formation of the gate electrode film, and thereafter patterning the gate electrode film to form a gate electrode.

7 Claims, 7 Drawing Sheets

METHOD FOR MANUFACTURING SEMICONDUCTOR DEVICE

BACKGROUND OF THE INVENTION

1. Field of the Invention

The present invention relates to a manufacturing method for a semiconductor device, and more particularly relates to a method of manufacturing a MOS transistor for improving reliability of a gate insulation film, and a method of manufacturing an EEPROM cell for improving reliability of a tunnel insulation film.

2. Description of the Related Art

Conventionally, when manufacturing a MOS transistor on a semiconductor substrate, the following process was used in order to improve reliability of a gate oxidation film.

First of all, as shown in FIG. 7A, an element separation film 40 on a silicon semiconductor substrate 39 and a gate insulation film 41 are formed using well known techniques.

Next, as shown in FIG. 7B, nitriding is carried out for the gate insulation film using a well known technique. Normally this nitriding is carried out for a short time at a high temperature, and the reliability of the gate insulation film is improved by this process.

Next, as shown in FIG. 7C, a gate electrode film 42(a) is formed using a well known technique.

Thereafter, as shown in FIG. 7D, the gate electrode film 42(a) is patterned and removed by etching to form a gate electrode film 42(b), and a MOS transistor comprising a transistor source/drain 43, an interlayer insulating film 44, a contact hole 45 and metal wiring 46 is formed by a well known technique.

With the manufacturing method of the related art, since the nitriding process is carried out for a short time at a high temperature after formation of the gate insulation film, a steep temperature gradient and the effects of oxygen cause the following problems.

1. Strain occurs in a silicon semiconductor substrate wafer, and positioning precision of a photolithography process is significantly degraded.
2. Slip lines occur in the silicon semiconductor substrate wafer, which are the cause of IC leak defects etc.

The object of the present invention is to improve a manufacturing method to solve the above described problems.

SUMMARY OF THE INVENTION

In a step of forming a MOS transistor on a semiconductor substrate, there is provided, between a process of forming a gate insulation film and a process of patterning a gate electrode film and removing the gate electrode film by etching, means for carrying out annealing using an inert gas.

Here, at least one of the following features is also included.

1. The inert gas is $N_2$.
2. The temperature of annealing with inert gas is at least 925° C.
3. After formation of the insulating gate film, RTA (Rapid Thermal Annealing) is carried out in a gas atmosphere including at least one of nitrogen atoms or oxygen atoms.
4. The gas atmosphere including at least one of nitrogen atoms or oxygen atoms is $N_2O$ or $O_2$.
5. The temperature of RTA processing is higher than 1000° C.
6. After formation of an insulating gate film over the entire surface of the semiconductor substrate, annealing is carried out using an inert gas.

Further, in a step of forming an EEPROM on a semiconductor substrate, there is provided, between a process of forming a tunnel insulation film and a process of patterning a floating gate electrode film and removing the floating gate electrode film by etching, means for carrying out annealing using an inert gas.

Here, at least one of the following features is also included.

1. The inert gas is $N_2$.
2. The temperature of annealing with inert gas is at least 925°C.
3. After formation of the a tunnel insulating film, RTA (Rapid Thermal Annealing) is carried out in a gas atmosphere including at least one of nitrogen atoms or oxygen atoms.
4. After formation of a floating electrode film over the entire surface of the semiconductor substrate, annealing is carried out using an inert gas.

With the means described above, the manufacturing method of the present invention brings about the following effects.

1. Strain of the semiconductor substrate wafer can be resolved without any increase in contamination of the gate insulation film.
2. It is possible to maintain high positioning precision in a photolithography process after nitriding.

Also, in a step of forming a MOS transistor on a semiconductor substrate, there are provided a process of forming a gate insulation film and, after forming the gate insulation film, means for carrying out heat treatment in a gas atmosphere including oxygen atoms at a temperature of less than 1000° C.

Here, at least one of the following features is also included.

1. The gas including oxygen atoms is $N_2O$.
2. The gas including oxygen atoms is $O_2$.
3. Between a step of forming the gate insulating film and a step of carrying out heat treatment in a $O_2$ atmosphere, heat treatment is carried out in a $NH_3$ atmosphere.
4. The heat treatment at less than 1000° C. is RTA (Rapid Thermal Annealing).

Also, in a step of forming a MOS transistor on a semiconductor substrate, there are provided a process of forming a gate insulation film and, after forming the gate insulation film, means for carrying out heat treatment in a gas atmosphere including oxygen atoms at a temperature of less than 1000° C.

Here, at least one of the following features is also included.

1. The gas including oxygen atoms is $N_2O$.
2. The gas including oxygen atoms is $O_2$.
3. Between a step of forming the gate insulating film and a step of carrying out heat treatment in an $O_2$ atmosphere, heat treatment is carried out in an $NH_3$ atmosphere.
4. The heat treatment at less than 1000° C. is RTA (Rapid Thermal Annealing).

With the means described above, the manufacturing method of the present invention brings about the following effects.

1. There is no strain generated in the semiconductor substrate wafer.
2. There are no slip lines generated in the semiconductor substrate wafer.

3. It is possible to maintain high positioning precision in a photolithography process after nitriding.

BRIEF DESCRIPTION OF THE DRAWINGS

The above and other objects as well as advantages of the present invention will become clear by the following description of the preferred embodiments of the present invention with reference to the accompanying drawings.

DETAILED DESCRIPTION OF THE PREFERRED EMBODIMENTS

A first embodiment of the present invention will now be described in the following. A first embodiment of the present invention will hereinafter be described with reference to FIGS. 1A to 1E.

Figure 1A:
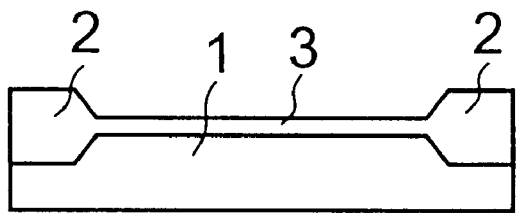
FIGS. 1A to 1E are cross sectional views showing the steps of a method of manufacturing a semiconductor device according to a first embodiment of the present invention.

First of all, as shown in FIG. 1A, an element separation film 2 on a silicon semiconductor substrate 1 is formed using well known techniques, and a gate insulation film 3 is formed to a thickness of 30–350 Å using, for example, thermal oxidation of the silicon semiconductor substrate.

Figure 1B:
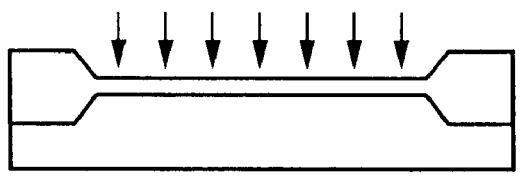

Next, as shown in FIG. 1B, nitriding is carried out for the gate insulation film. With this process, a boundary level, trap and unbonded crystal atoms of the gate insulation film boundary are filled with nitrogen, and the reliability of a gate insulation film with respect to hot electron resistance, etc., is improved.

Normally this process is carried out at an extremely high temperature using RTA (Rapid Thermal Annealing) such as ramp annealing, for example, processing in an $N_2O$ atmosphere at 800–1125° C. for 15–120 seconds, processing in an $NH_3$ atmosphere at a temperature of 800–1100° C. for 5–90 seconds, or processing in an $O_2$ atmosphere at a temperature of 800–1125° C. for 15–120 seconds.

Because of the existence of oxygen during the nitriding process, strain does not arise in the silicon semiconductor wafer, and this is particularly noticeable when processing at a temperature higher than 1000° C.

Figure 1C:
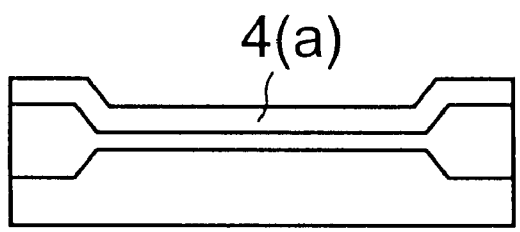

Next, as shown in FIG. 1C, a gate electrode film 4(a) is formed to a thickness of 1000–4000 Å using, for example, polycrystal silicon.

Figure 1D:
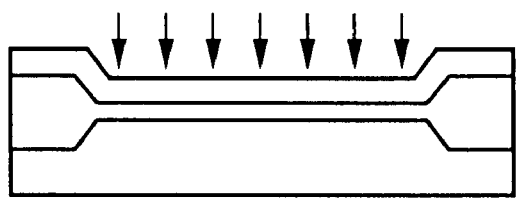

Next, as shown in FIG. 1D, using a thermal oxidation furnace, annealing is carried out under an inert gas atmosphere, for example under a nitrogen atmosphere at a temperature of 925–1025° C. for 10–30 minutes, or under an argon atmosphere at a temperature of 925–1025° C. for 10–30 minutes.

Because of this inert gas annealing, strain in the silicon semiconductor substrate wafer is resolved. Also, since inert gas is used with this annealing, there is no inadvertent oxidation of the gate electrode film 4(a).

Here, even if inert gas annealing shown in FIG. 1D is carried out after nitriding processing for the previously mentioned gate insulation film 3 and before formation of the gate insulation film 4(a), it goes without saying that the effect of resolving strain in the silicon semiconductor substrate is obtained.

Moreover, if the quality of the gate insulation film is taken into consideration, undergoing the annealing process with the gate insulation film still exposed increases the changes of the gate insulation film becoming contaminated, which means that from the point of view of quality it is preferable to perform the inert gas annealing after formation of the gate electrode film 4(a).

Figure 1E:
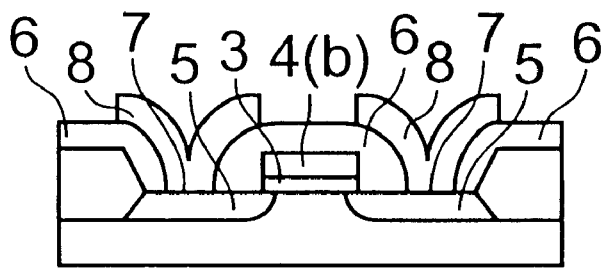

Continuing on, as shown in FIG. 1E, the gate electrode film 4(a) is patterned and removed by etching to form a transistor gate electrode film 4(b), and a MOS transistor comprising a transistor source/drain, an interlayer insulating film 6, a contact hole 7 and metal wiring 8 is formed by a well known technique.

A second embodiment of the present invention, being the first embodiment applied to an EEPROM cell, will now be described.

Figure 2A:
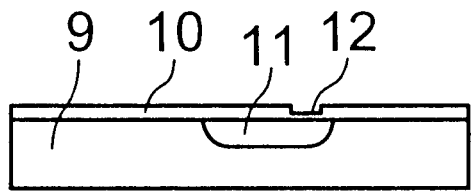
FIGS. 2A to 2E are cross sectional views showing the steps of a method of manufacturing a semiconductor device according to a second embodiment of the present invention.

First of all, as shown in FIG. 2A, an element separation film is formed on a silicon semiconductor substrate 9, as required, and a gate insulation film 10 is formed to a thickness of 200–700 Å by, for example, thermal oxidation of the silicon semiconductor substrate. After that, a tunnel drain 11 constituting a drain section of a cell transistor of the EEPROM cell is formed by, for example, an ion injection method, a tunnel window section is formed using a well known technique, and then a tunnel insulation film 12 is formed to a thickness of 15–120 Å by, for example, thermal oxidation.

Figure 2B:
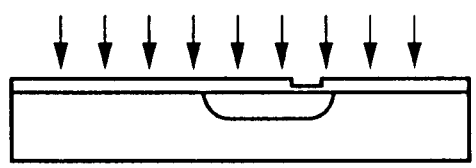

Next, as shown in FIG. 2B, nitriding is carried out for the gate insulation film at the same time as for the tunnel insulating film. As a result of this processing, a boundary level, trap, and unbonded crystal atoms of the boundary of the tunnel insulation film and the gate insulation film are filled with nitrogen, and the resistance to overwriting, resistance to hot electrons and reliability of each of the insulation films is improved.

Normally this process is carried out at an extremely high temperature using RTA (Rapid Thermal Annealing) such as ramp annealing, for example, processing in an $N_2O$ atmosphere at 800–1125° C. for 15–120 seconds, processing in an $NH_3$ atmosphere at a temperature of 800–1100° C. for 5–90 second, or processing in an $O_2$ atmosphere at a temperature of 800–1125° C. for 15–120 seconds.

Because of the existence of oxygen during the nitriding process, strain does not arise in the silicon semiconductor wafer, and this is particularly noticeable when processing at a temperature higher than 1000° C.

Figure 2C:
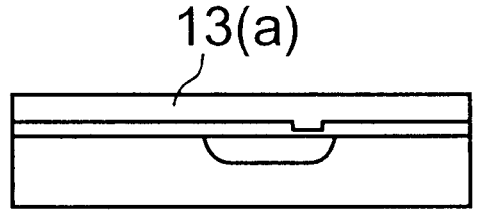

Next, as shown in FIG. 2C, a gate electrode film 13(a) is formed to a thickness of 1000–4000 Å using, for example, polycrystal silicon.

Figure 2D:
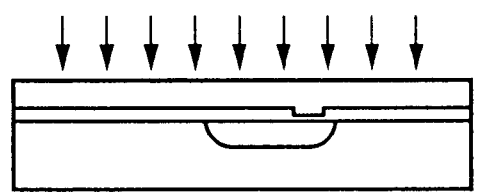

Next, as shown in FIG. 2D, using a thermal oxidation furnace, annealing is carried out under an inert gas atmosphere, for example under a nitrogen atmosphere at a temperature of 925–1025° C. for 10–30 minutes, or under an argon atmosphere at a temperature of 925–1025° C. for 10–30 minutes.

Because of this inert gas annealing, strain in the silicon semiconductor substrate wafer is resolved. Also, since inert gas is used with this annealing, there is no inadvertent oxidation of the gate electrode film 4(a).

Here, even if inert gas annealing shown in FIG. 2(d) is carried out after the previously mentioned nitriding processing and before formation of the gate insulation film 13(a), it goes without saying that the effect of resolving strain in the silicon semiconductor substrate is obtained.

Also, if the quality of the tunnel insulation film and gate insulation film are taken into consideration, undergoing the annealing process with the gate film surfaces still exposed increases the chances of each of the gate insulation films becoming contaminated, which means that from the point of view of quality it is preferable to perform the inert gas annealing after formation of the gate electrode film 4(a)

Figure 2E:
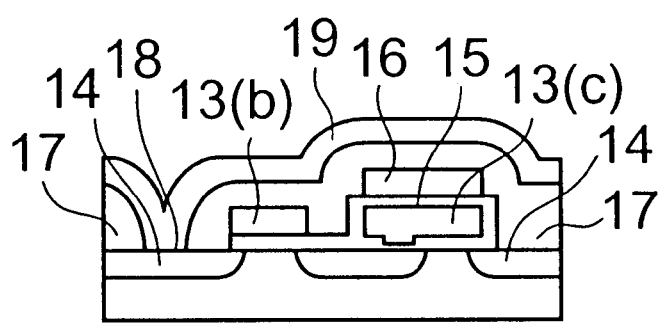

Continuing on, as shown in FIG. 2(e), the gate electrode film is patterned and removed by etching to form a select gate electrode film 13(b) and a floating gate electrode film 13(c) of the EEPROM cell, a source/drain 14 of the EEPROM cell is formed by the following well known technique, and through a gate electrode film interlayer insulation film 15 formed on the floating gate electrode film 13(c), a control gate electrode film 16 is formed using, for example, polycrystal silicon, thus constructing an EEPROM cell comprising an interlayer insulation film 17, contact hole 18 and metal wiring 19.

Here, even in the case where the structure of the EEPROM cell uses only single layer polycrystal silicon, it goes without saying that all of the same effects can be obtained by adopting the present invention.

An example of resolving strain in a silicon semiconductor wafer using the present invention will be shown below.

Figure 3A:
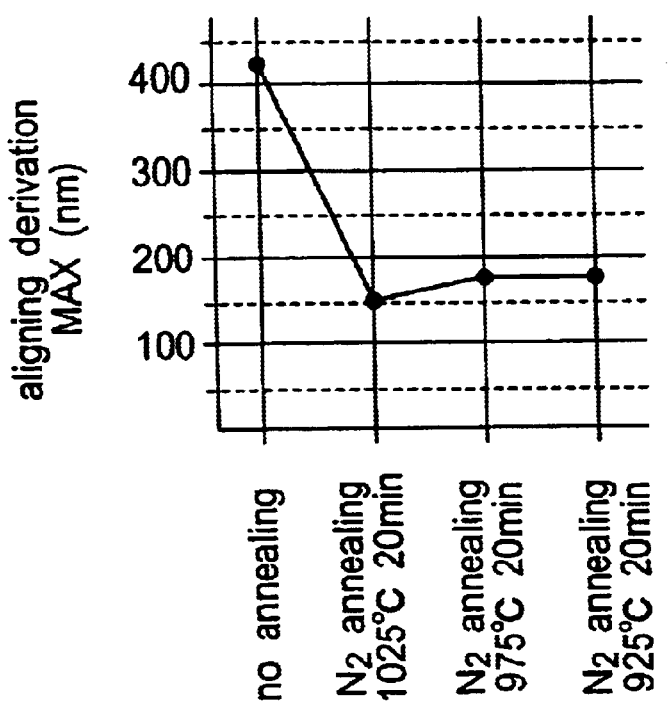
FIGS. 3A to 3B are graphical representation each useful in the deviation amount in the second embodiment of the present invention.
Figure 3B:
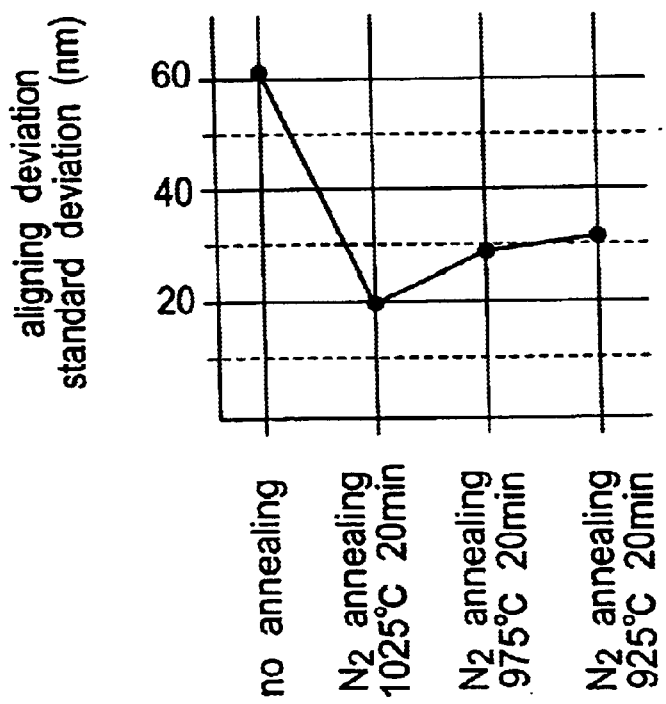

A maximum value for an amount of in plane positional variation of a silicon semiconductor wafer at the time of patterning a gate electrode film 13(a) of the second embodiment of the present invention is shown in FIG. 3A, while standard deviation of the inplane positional variation of the wafer is shown in FIG. 3B.

To nitride the gate electrode film, $NH_3$ and $O_2$ processing is carried out. As is clear from the drawing, by carrying out annealing under a nitrogen atmosphere after the above mentioned nitriding process, the amount of positional variation is improved significantly compared to the case where the nitriding process is not performed.

A third embodiment of the present invention will now be described as follows.

Figure 4A:
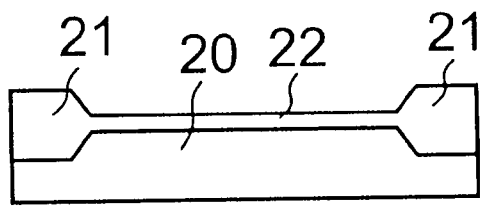
FIGS. 4A to 4D are cross sectional views showing the steps of a method of manufacturing a semiconductor device according to a third embodiment of the present invention.

First of all, as shown in FIG. 4A, an element separation film 21 is formed on a silicon semiconductor substrate 20 using a well known technique, and a gate insulation film 22 is formed to a thickness of 30–350 Å using, for example, thermal oxidation of the silicon semiconductor substrate.

Figure 4B:
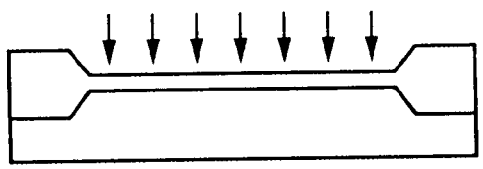

Next, as shown in FIG. 4B, nitriding is carried out for the gate insulation film. With this process, a boundary level, trap and unbonded crystal atoms of the gate insulation film boundary are filled with nitrogen, and the reliability of a gate insulation film with respect to hot electron resistance, etc., is improved.

This process is carried out using RTA (Rapid Thermal Annealing) such as ramp annealing, for example, processing in an $N_2O$ atmosphere at a temperature of 800–1000° C. for 15–120 seconds, processing in an $NH_3$ atmosphere at a temperature of 800 1100° C. for 5–90 seconds, or processing in an $O_2$ atmosphere at a temperature of 800–1000° C. for 15–120 seconds.

Here, since the process temperature under a gas atmosphere containing nitrogen is less than 1000° C., no strain or slip lines occur in the silicon semiconductor substrate due to the nitriding process.

Figure 4C:
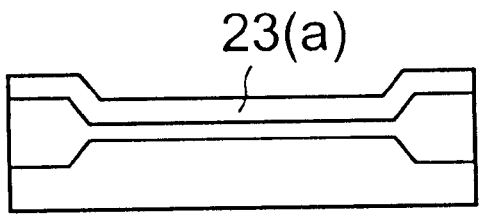

Next, as shown in FIG. 4C, a gate electrode film 23(a) is formed to a thickness of 1000–4000 Å using, for example, polycrystal silicon.

Figure 4D:
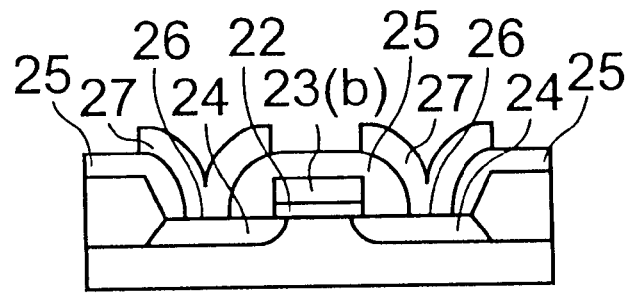

Continuing on, as shown in FIG. 4D, the gate electrode film 23(a) is patterned and removed by etching to form a transistor gate electrode film 23(b), and a MOS transistor comprising a transistor source/drain 24, an interlayer insulating film 25, a contact hole 26 and metal wiring 27 is formed by the following well known technique.

A fourth embodiment of the present invention, being the third embodiment applied to an EEPROM cell, will now be described.

Figure 5A:
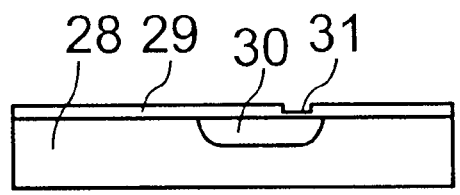
FIGS. 5A to 5D are cross sectional views showing the steps of a method of manufacturing a semiconductor device according to a fourth embodiment of the present invention.

First of all, as shown in FIG. 5A, an element separation film is formed on a silicon semiconductor substrate 28, as required, and a gate insulation film 29 is formed to a thickness of 200–700 Å by, for example, thermal oxidation of the silicon semiconductor substrate. After that, a tunnel drain 30 constituting a drain section of a cell transistor of the EEPROM cell is formed by, for example, an ion injection method, a tunnel window section is formed using a well known technique, and then a tunnel insulation film 31 is formed to a thickness of 15–120 Å by, for example, thermal oxidation.

Figure 5B:
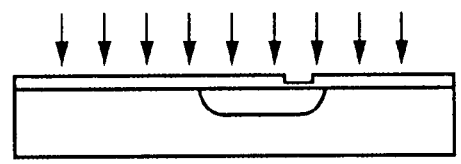

Next, as shown in FIG. 5B, nitriding is carried out for the gate insulation film at the same time as for the tunnel insulating film. As a result of this processing, a boundary level, trap, and unbonded crystal atoms of the boundary of the tunnel insulation film and the gate insulation film are filled with nitrogen, and the resistance to overwriting, resistance to hot electrons and reliability of each of the insulation films is improved.

This process is carried out using RTA (Rapid Thermal Annealing) such as ramp annealing, for example, processing in an $N_2O$ atmosphere at a temperature of 800–1000° C. for 15–120 seconds, processing in an $NH_3$ atmosphere at a temperature of 800 1100° C. for 5–90 seconds, or processing in an $O_2$ atmosphere at a temperature of 800–1000° C. for 15–120 seconds.

Here, since the process temperature under a gas atmosphere containing nitrogen is less than 1000° C., no strain or slip lines occur in the silicon semiconductor substrate due to the nitriding process.

Figure 5C:
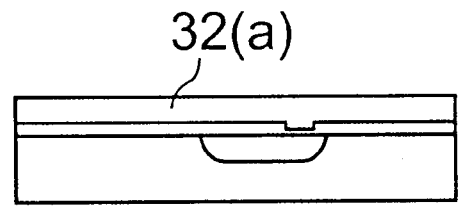

Next, as shown in FIG. 5C, a gate electrode film 32(a) is formed to a thickness of 1000–4000 Å using, for example, polycrystal silicon.

Figure 5D:
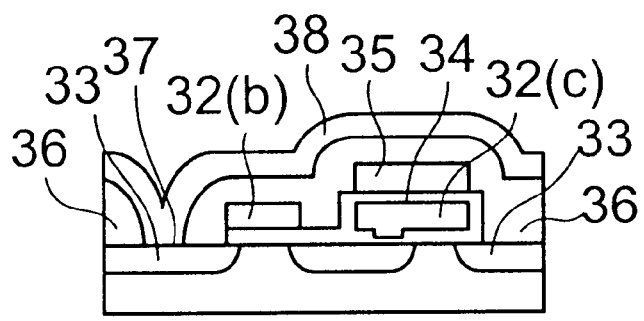

Continuing on, as shown in FIG. 5D, the gate electrode film 32(a) is patterned and removed by etching to form a select gate electrode film 32(b) and a floating gate electrode film 32(c) of the EEPROM cell, a source/drain 33 of the EEPROM cell is formed by the following well known technique, and through a gate electrode film interlayer insulation film 34 formed on the floating gate electrode film 32(c), a control gate electrode film 35 is formed using, for example, polycrystal silicon, thus constructing an EEPROM cell comprising an interlayer insulation film 36, contact hole 37 and metal wiring 38.

Here, even in the case where the structure of the EEPROM cell uses only single layer polycrystal silicon, it goes without saying that all of the same effects can be obtained by adopting the present invention.

An example of suppressing strain in a silicon semiconductor wafer using the present invention is described below.

Figure 6A:
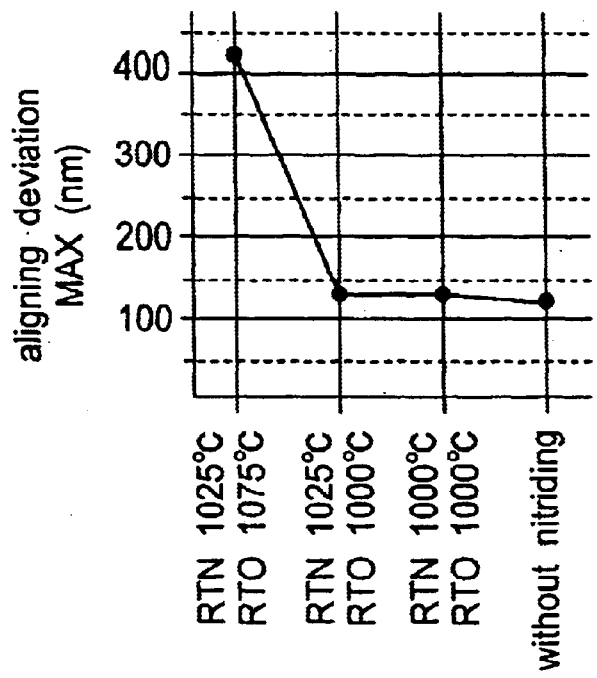
FIGS. 6A to 6B are graphical representation each useful in the deviation amount in the fourth embodiment of the present invention.
Figure 6B:
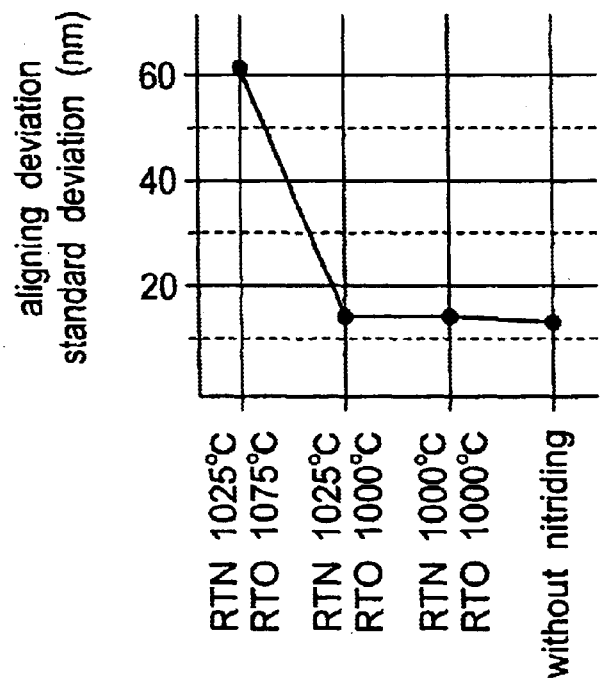
Figure 7A:
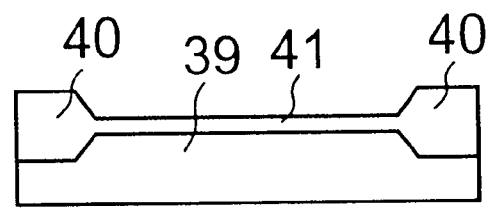
FIGS. 7A to 7D are cross sectional views showing the steps of a method of manufacturing a semiconductor device according to the prior art.
Figure 7B:
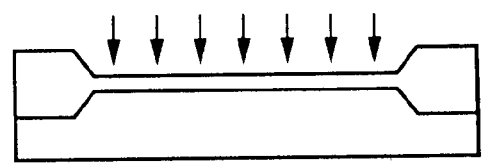
Figure 7C:
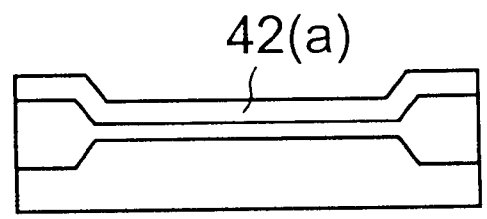
Figure 7D:
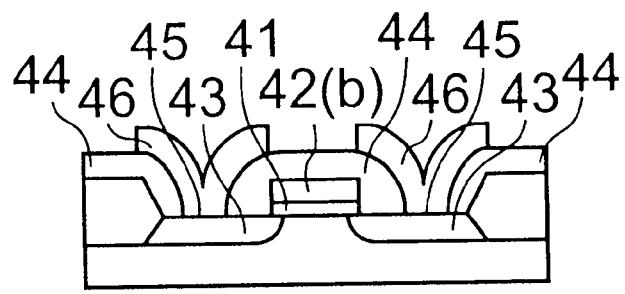

A maximum value for an amount of in-plane positional variation of a silicon semiconductor wafer at the time of patterning a gate electrode film 32(*a*) of the fifth embodiment of the present invention is shown in FIG. 6A, while standard deviation of the in-plane positional variation of the wafer is shown in FIG. 6B.

In nitriding the gate insulation film, each of $NH_3$ processing (RTN) and $O_2$ processing (RTO) are carried out with each of the processing times fixed. As is clear from the drawings, after the nitriding process, by carrying out RTO under an $O_2$ atmosphere at 1000° C. the amount of positional variation is significantly improved, and is at a similar level to when nitriding is not carried out.

As described above, the present invention maintains positional accuracy on a photolithography process at a high level by resolving strain of a semiconductor substrate wafer die to annealing in an inert gas atmosphere after a nitriding process, and suppresses the generation of slip lines and suppresses strain in a semiconductor substrate wafer by keeping the temperature of processing under a gas atmosphere containing nitrogen in nitriding processing at less than 1000° C., and so has the following effects.

1. With design standards having positioning margins estimated to the minimum necessary, the level of integration for an IC can be increased.

2. It is possible to make manufacturing yield highly stable.

What is claimed is:

1. A method for manufacturing a semiconductor device, comprising the steps of: forming a gate oxide film on a surface of a semiconductor substrate; subjecting the gate oxide film to a nitriding treatment; forming a gate electrode film over the surface of the semiconductor substrate; annealing the gate oxide film in an inert gas atmosphere after the nitriding treatment and after forming the gate electrode film; and thereafter patterning the gate electrode film to form a gate electrode.

2. A method according to claim 1; wherein the inert gas is $N_2$.

3. A method according to claim 1; wherein the annealing step comprises annealing the gate oxide film in an inert gas atmosphere at a temperature of at least 925° C.

4. A method according to claim 2; wherein the nitriding treatment is carried out by rapid thermal annealing in a gas atmosphere including at least one of nitrogen atoms and oxygen atoms.

5. A method according to claim 4; wherein the gas atmosphere includes $N_2O$.

6. A method according to claim 4; wherein the rapid thermal annealing is carried out at a temperature higher than 1000° C.

7. A method according to claim 4; wherein the step of forming a gate electrode film comprises forming a gate electrode film over the entire surface of the semiconductor substrate.

* * * * *